United States Patent
Osari (10) Patent No.: US 7,482,660 B2
(45) Date of Patent: Jan. 27, 2009

(54) NONVOLATILE SEMICONDUCTOR MEMORY WITH TRANSISTOR WHOSE GATE ELECTRODE HAS BIRD'S BEAK

(75) Inventor: Kanji Osari, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 111 days.

(21) Appl. No.: 11/485,370

(22) Filed: Jul. 13, 2006

(65) Prior Publication Data
US 2007/0012990 A1 Jan. 18, 2007

(30) Foreign Application Priority Data
Jul. 15, 2005 (JP) .............................. 2005-207671

(51) Int. Cl.
*H01L 29/76* (2006.01)
(52) U.S. Cl. .................. 257/393; 257/900; 257/315; 257/E21.626; 438/265; 438/283
(58) Field of Classification Search ........... 257/393, 257/E21.626
See application file for complete search history.

(56) References Cited

U.S. PATENT DOCUMENTS

| | | | |
|---|---|---|---|
| 5,976,934 A * | 11/1999 | Hayakawa | ............... 438/258 |
| 5,986,302 A | 11/1999 | Fukatsu et al. | |
| 6,228,717 B1 | 5/2001 | Hazama et al. | |
| 6,548,363 B1 | 4/2003 | Wu et al. | |

FOREIGN PATENT DOCUMENTS

| | | |
|---|---|---|
| JP | 6-310731 | 11/1994 |
| JP | 7-249697 | 9/1995 |
| JP | 10-65028 | 3/1998 |
| JP | 10-284626 | 10/1998 |

* cited by examiner

*Primary Examiner*—Tu-Tu V Ho
(74) *Attorney, Agent, or Firm*—Oblon, Spivak, McClelland, Maier & Neustadt, P.C.

(57) ABSTRACT

A nonvolatile semiconductor memory according to an example of the present invention is provided with a memory cell having a floating gate electrode and a control gate electrode, and a select gate transistor having a select gate electrode and connected in series to the memory cell. A cell unit is comprised with the memory cell and the select gate transistor. A bird's beak of the edge at the memory cell side of the select gate electrode is larger than a bird's beak of at least one edge of the floating gate electrode.

7 Claims, 12 Drawing Sheets

*) Size of bird's beak is defined by thickness of oxide film 25 formed on Bulk-Si

F I G. 31

NONVOLATILE SEMICONDUCTOR MEMORY WITH TRANSISTOR WHOSE GATE ELECTRODE HAS BIRD'S BEAK

CROSS-REFERENCE TO RELATED APPLICATIONS

This application is based upon and claims the benefit of priority from prior Japanese Patent Application No. 2005-207671, filed Jul. 15, 2005, the entire contents of which are incorporated herein by reference.

BACKGROUND OF THE INVENTION

1. Field of the Invention

The present invention relates to a nonvolatile semiconductor memory, for example, a flash memory which performs data writing using FN tunneling.

2. Description of the Related Art

There are common problems in a flash memory performing data writing using an FN tunneling, that is, a leak current caused by an inter-band tunneling at an unselected cell at the time of data writing and charge retention characteristics of a memory cell.

The leak current generated at the unselected cell lowers step-up capability of a step-up circuit generating high voltage; therefore there is a danger that the data writing itself cannot be performed. Further, as miniaturization of a memory cell is advanced, a leak rate of a charge within a floating gate electrode becomes high, and retention period of data (charge) becomes short.

As one method for solving such problems, a technique is known which rounds an edge of the floating gate electrode of the memory cell and an edge of a select gate electrode of a select gate transistor due to thermal oxidation (for example, referring to Jpn. Pat. Appln. KOKAI Publication Nos. 6-310731, 7-249697, 10-65028, and 10-284626).

A degree of roundness of the edge is specified with a size of a bird's beak because a shape of a thermal oxide film formed in the edge is similar to the bird's beak. When enlarging the bird's beak, it is possible to realize the leak current prevention caused by the inter-band tunneling and improvement of charge retention characteristics.

However, when the bird's beak of the floating gate electrode of the memory cell becomes large, an average thickness of a tunnel oxide film (gate insulating film) becomes large, so that the writing characteristics, that is, efficiency for injecting charge into the floating gate electrode from a channel by an FN tunneling degrades.

Thus, conventionally, in the course of advancing miniaturization of the memory cell of the flash memory, it is not possible to realize simultaneously the prevention of the leak current caused by the inter-band tunneling and the improvement of the charge retention characteristics without deteriorating the writing characteristics.

BRIEF SUMMARY OF THE INVENTION

According to an aspect of the present invention, there is provided a nonvolatile semiconductor memory comprising a memory cell having a floating gate electrode and a control gate electrode, and a select gate transistor having a select gate electrode and connected to the memory cell in series, wherein a bird's beak of an edge at the memory cell side of the select gate electrode is larger than a bird's beak of at least one edge of the floating gate electrode.

According to an aspect of the present invention, there is provided a method of manufacturing a nonvolatile semiconductor memory comprising, forming a floating gate electrode of a memory cell and a select gate electrode of a select gate transistor, forming an insulating film which covers the floating gate electrode and the select gate electrode, exposing an edge at the memory cell side of at least the select gate electrode while etching partially the insulating film, and oxidizing both the floating gate electrode and the select gate electrode.

According to an aspect of the present invention, there is provided a method of manufacturing a nonvolatile semiconductor memory comprising, forming an edge at a select gate transistor side of a floating gate electrode and an edge at a memory cell side of a select gate electrode, oxidizing both the edge at the select gate transistor side of the floating gate electrode and the edge at the memory cell side of the select gate electrode, forming both an edge at an opposite side to the select gate transistor of the floating gate electrode and an edge at an opposite side to the memory cell of the select gate electrode, and oxidizing all edges of the floating gate electrode and the select gate electrode.

DETAILED DESCRIPTION OF THE INVENTION

A nonvolatile semiconductor memory of an aspect of the present invention will be described below in detail with reference to the accompanying drawing.

1. OUTLINE

In an example of the present invention, prevention of a leak current caused by an inter-band tunneling and improvement of charge retention characteristics are realized without deteriorating writing characteristics by enlarging a bird's beak of an edge at a memory cell side of a select gate electrode than a bird's beak of at least one edge of a floating gate electrode.

As the flash memory performing the data writing using the FN tunneling, at present, kinds of NAND-type, 3Tr NAND-type, NANO-type and the like are known. In the NAND-type, a cell unit has configuration of two select gate transistors and a plurality of memory cells which are connected between the two select gate transistors in series.

In the 3Tr NAND-type, a cell unit has configuration of two select gate transistors and one memory cell which is connected between the two select gate transistors in series. Further, in the NANO-type, a cell unit has configuration of a series connection of one select gate transistor and one memory cell, thereby the NANO-type has characteristics in that it has both advantages of the NAND-type and a NOR-type.

In such a flash memory, in order to realize prevention of the leak current caused by the inter-band tunneling and improvement of the charge retention characteristics, it may be preferable to round an edge of the floating gate electrode of the memory cell and an edge of the select gate electrode of the select gate transistor by thermal oxidation.

However, when rounding the edge of the floating gate electrode of the memory cell and the edge of the select gate electrode of the select gate transistor impartially, average thickness of the tunnel oxide film becomes large, so that it is not possible to cope with both the writing characteristics, and prevention of the leak current caused by the inter-band tunneling and improvement of the charge retention characteristics.

Consequently, in an example of the present invention, first, a cause of the leak current caused by the inter-band tunneling is investigated.

Figure 1:
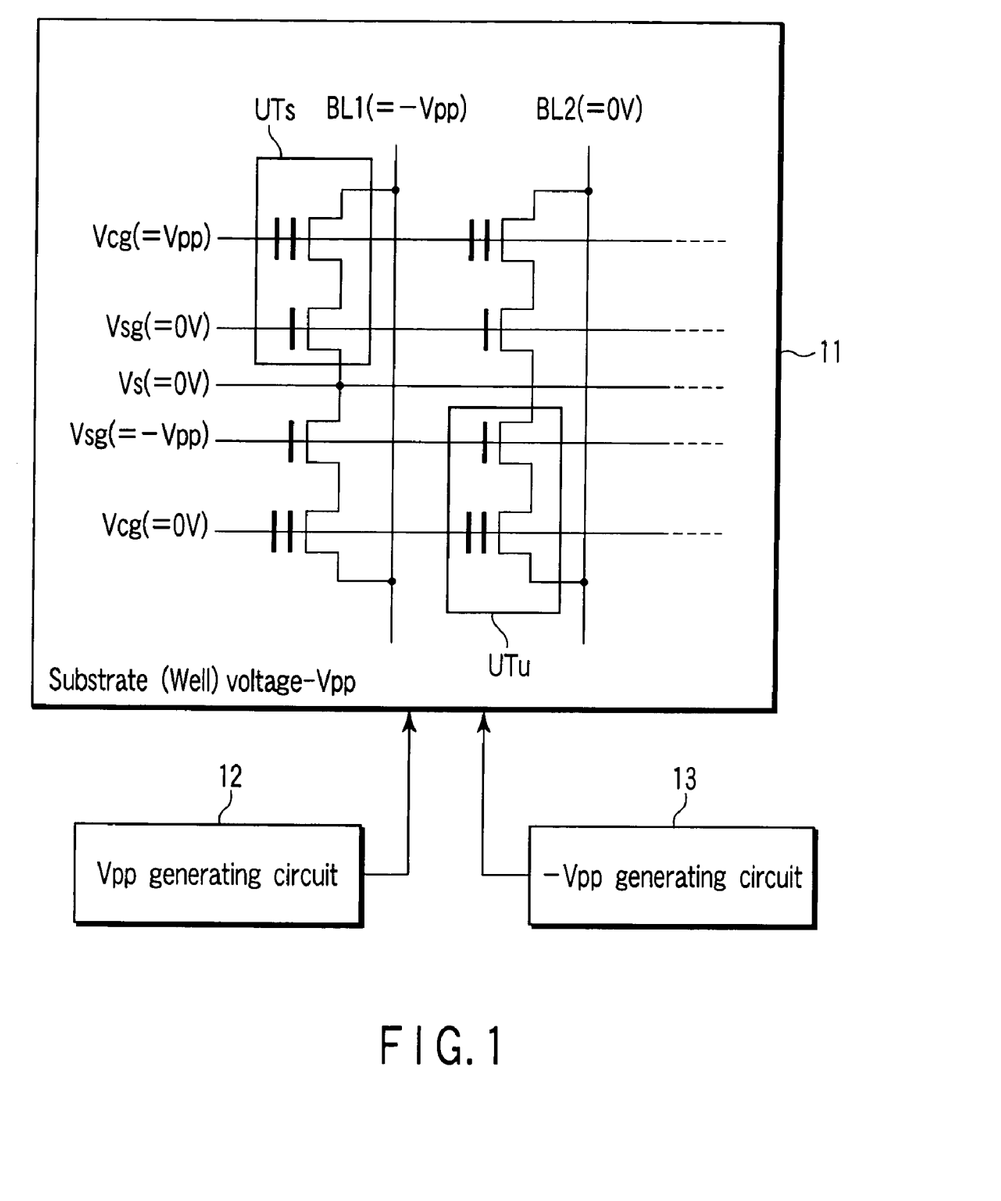
FIG. 1 is a view showing an example of a memory cell array of a flash memory.
Figure 2:
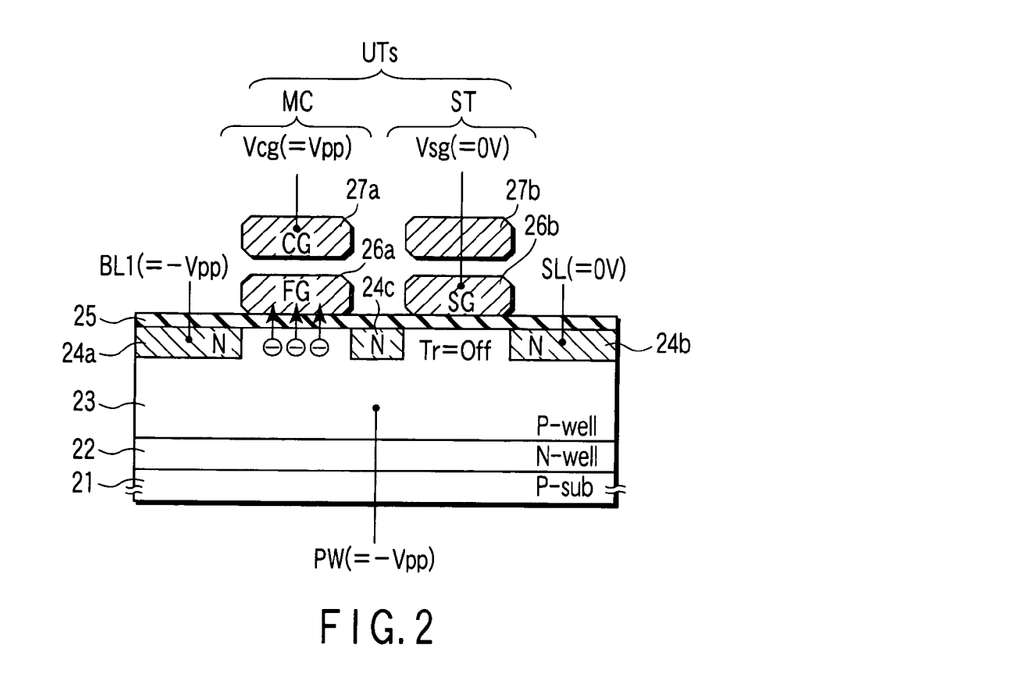
FIG. 2 is a view showing a voltage relation of a selected unit at the time of data writing.
Figure 3:
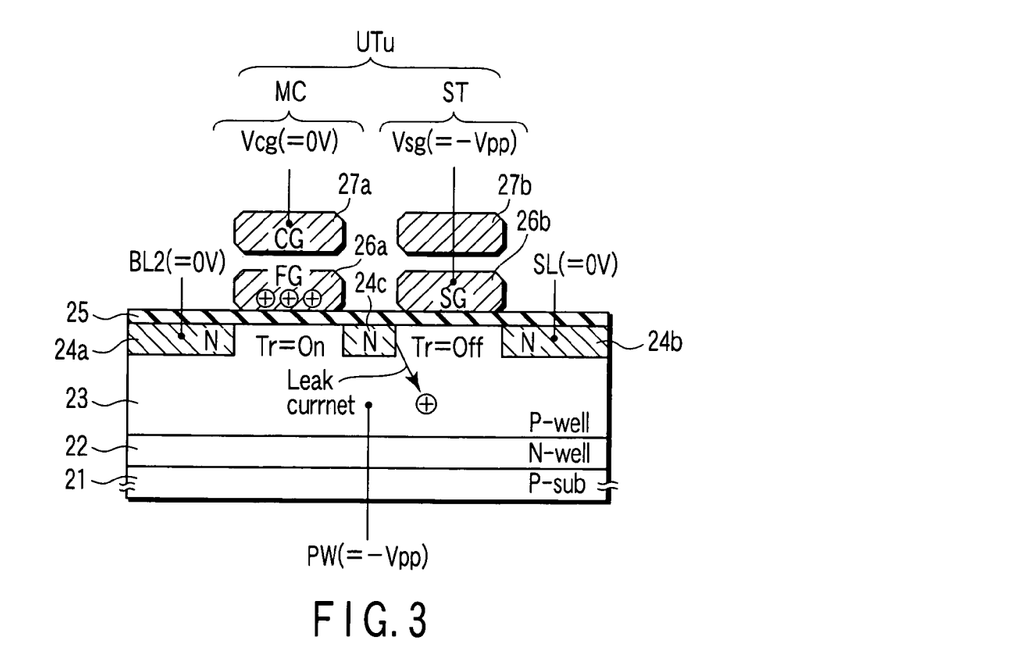
FIG. 3 is a view showing a voltage relation of an unselected unit at the time of data writing.

FIG. 1 shows a memory cell array of the NANO-type flash memory. FIG. 2 shows a voltage relation of a selected unit UTs at the time of data writing, and FIG. 3 shows a voltage relation of an unselected unit UTu at the time of data writing.

In a floating gate electrode 26a of a memory cell MC and a select gate electrode 26b of a select gate transistor ST, edges are rounded by the bird's beak with the same size.

An initialized state of all the memory cells MC is an erased state, a hole (plus charge) is accumulated within the floating gate electrode (FG) 26a, and a threshold value results in minus. The data writing is carried out to the memory cell MC within the selected unit UTs from this state. That is, the threshold value is made plus while injecting the electron (minus charge) into the floating gate electrode 26a of the memory cell MC within the selected unit UTs.

In the selected unit UTs, a voltage Vsg of a select gate electrode (SG) 26b of the select gate transistor ST is made 0 V, and a voltage Vcg of the control gate electrode 26a of the memory cell MC is made Vpp. Further, a voltage of a bit line BL1 is made −Vpp, and a voltage Vs of a source line SL is made 0 V.

In the unselected unit UTu, a voltage Vsg of the select gate electrode 26b of the select gate transistor ST is made −Vpp, a voltage Vcg of the control gate electrode 26a of the memory cell MC is made 0 V. Further, both a voltage of a bit line BL2 and a voltage Vs of the source line SL are made 0 V.

In both the selected unit UTs and the unselected unit UTu, a voltage PW of a P-type well region 23 on which these cell units are formed is made to set to −Vpp.

When setting the voltage relation in the above, in the selected unit UTs, as shown in FIG. 2, high voltage is applied between the channel of the memory cell MC and the floating gate electrode 26a, and the electron is injected into the floating gate electrode 26a.

At this time, in the unselected unit UTu, as shown in FIG. 3, the memory cell MC becomes on, and the select gate transistor ST becomes off, and the leak current I is generated by the inter-band tunneling from the bit line BL2 toward the P-type well region 23 via N-type diffusion layers 24a, 24c.

In this case, the hole (plus charge) is always supplied to the P-type well region 23 common to the selected unit UTs and the unselected unit UTu, so that it lowers a step-up capability of a −Vpp generation circuit 13 determining a voltage of the P-type well region. For this reason, the sufficient high voltage is not applied between the channel of the memory cell MC within the selected unit UTs and the floating gate electrode 26a; thereby the data writing cannot be performed.

When investigating the leak current caused by the inter-band tunneling in detail, it is found that the leak current is generated mainly at a drain (memory cell MC side N-type diffusion layer) 24c of the select gate transistor ST. Its cause is that, in the unselected unit UTu, when the memory cell MC is on, a high electric field is generated between the drain 24c of the select gate transistor ST and the select gate electrode 26b.

Accordingly, in an example of the present invention, first, size of the bird's beak of the edge of the floating gate electrode 26a of the memory cell MC is determined independently in order to cope with both the improvement of the writing characteristics and the improvement of the charge retention characteristics.

Then, as for the leak current caused by the inter-band tunneling, the leak current is prevented by determining the bird's beak of the edge at the memory cell MC side of the select gate electrode 26b independently of the bird's beak of the edge of the floating gate electrode 26a.

Specifically, the bird's beak of the edge at the memory cell MC side of the select gate electrode 26b is made larger than the bird's beak of at least one edge of the floating gate electrode 26a.

Due to this, prevention of the leak current caused by the inter-band tunneling and improvement of the charge retention characteristics are realized without deteriorating the writing characteristics.

By the way, thickness of the gate insulating film of the select gate transistor ST may be equal to or thicker than thickness of the tunnel oxide film (gate insulating film) of the memory cell MC.

2. EMBODIMENTS

Next, there will be explained some embodiments which are conceivable as the best mode with a cell unit of the NANO-type flash memory as an example.

(1) First Embodiment

A. Device Configuration

Figure 4:
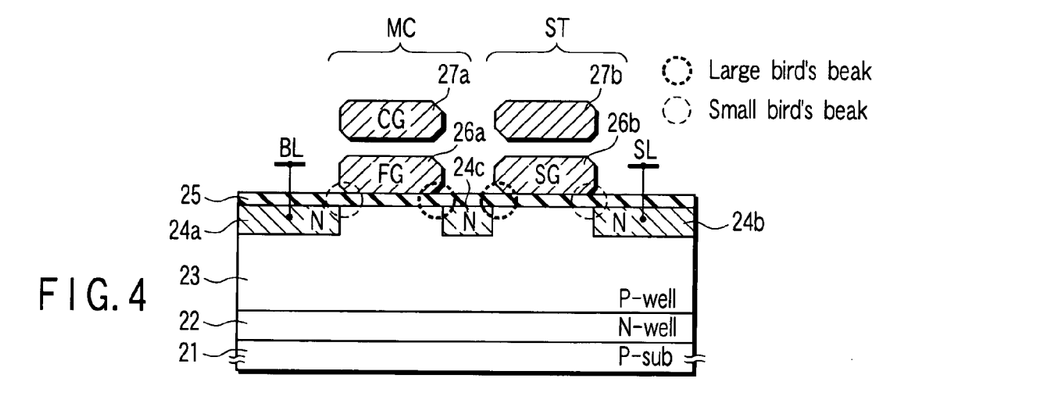
FIG. 4 is a view showing a device structure of a first embodiment.

FIG. 4 shows a cell unit configuring a memory cell array.

A double well composed of an N-type well region (N-well) 22 and a P-type well region (P-well) 23 is formed on a surface region of a P-type semiconductor substrate (P-sub) 21.

In the P-type well region 23, an N-type diffusion layer (drain) 24a connected to a bit line BL, an N-type diffusion layer (source) connected to a source line SL and an N-type diffusion layer (source/drain) 24c shared by the memory cell MC and the select gate transistor ST are formed.

A floating gate electrode 26a and a control gate electrode 27a are formed on a channel between N-type diffusion layers 24a, 24c via a gate insulating film 25. Further, a select gate electrode 26b is formed on a channel between N-type diffusion layers 24b, 24c via the gate insulating film 25.

Both the memory cell MC and the select gate transistor ST have stack gate structure. As for the select gate transistor ST, an upper electrode 27b may be electrically connected to a lower electrode (select gate electrode) 26b, or may be independent electrically.

Then, the bird's beak of the edge at the memory cell MC side of the select gate electrode 26b is larger than the bird's beak of at least one edge of the floating gate electrode 26a, that is, larger than the bird's beak of the edge at an opposite side (N-type diffusion layer 24a side) to the select gate transistor ST.

Due to this, since it is possible to relieve sufficiently a high electric field generated between the drain 24c of the select gate transistor ST and the select gate electrode 26b at the time of data writing, it is possible to realize both prevention of the leak current caused by the inter-band tunneling and improvement of the charge retention characteristics without deteriorating the writing characteristics.

B. Manufacturing Method

Next, there will be explained a method of manufacturing a device structure of FIG. 4.

First Example

Figure 5:
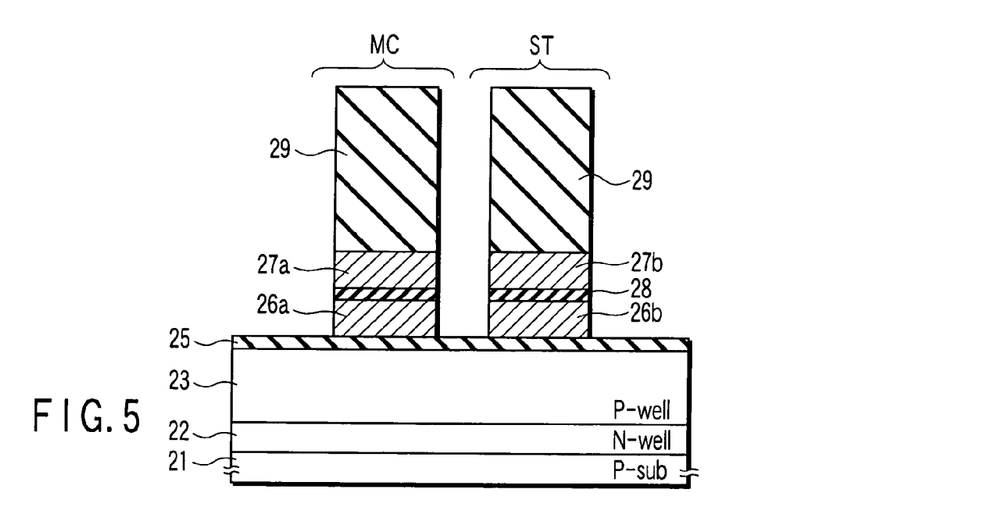
FIG. 5 is a view showing a first example of a method of manufacturing a cell unit of FIG. 4.

First, as shown in FIG. 5, a double well composed of an N-type well region 22 and a P-type well region 23 is formed on a surface region of a P-type semiconductor substrate 21. Further, after being subjected to an element separation process, for instance, a gate insulating film 25 made of a silicon oxide is formed on the P-type well region 23 by the CVD method.

After that, a first layer conductive polysilicon, an inter-polymer insulating film (for instance, laminated film of silicon oxide/silicon nitride/silicon oxide) 28 and a second layer conductive polysilicon are formed on the gate insulating film 25.

A resist pattern composed of a photoresist 29 is formed by the photolithography, and then, the second layer conductive polysilicon, inter-polymer insulating film 28 and the first layer conductive polysilicon are etched sequentially by RIE with the resist pattern as a mask.

As a result, the floating gate electrode 26a of the memory cell MC and the control gate electrode 27a are formed, and the select gate electrode 26b of the select gate transistor ST is formed.

After that, the photoresist 29 is removed.

Figure 6:
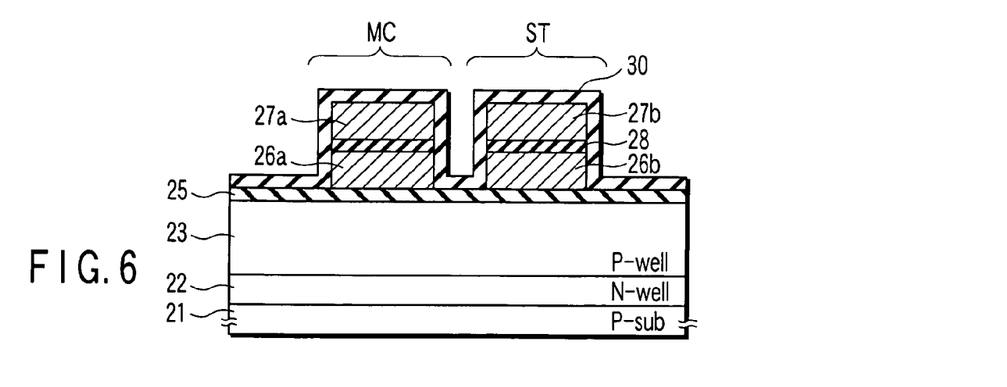
FIG. 6 is a view showing the first example of the method of manufacturing a cell unit of FIG. 4.

Next, as shown in FIG. 6, an insulating film 30, which covers the memory cell MC and the select gate transistor ST, is formed with the CVD method. The insulating film 30 is made of a material having a property for permeating oxygen, for instance, the silicon oxide.

Figure 7:
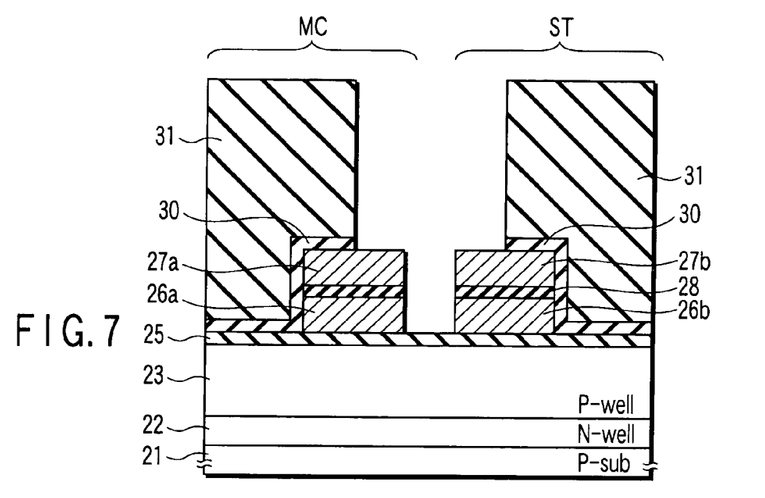
FIG. 7 is a view showing the first example of the method of manufacturing a cell unit of FIG. 4.

Next, as shown in FIG. 7, a resist pattern composed of a photoresist 31 is formed by the photolithography; then the insulating film 30 is etched by RIE with this resist pattern as the mask.

As a result, an edge at the select gate transistor ST side of the floating gate electrode 26a and an edge at the memory cell MC side of the select gate electrode 26b are exposed, respectively.

After that, the photoresist 31 is removed.

Figure 8:
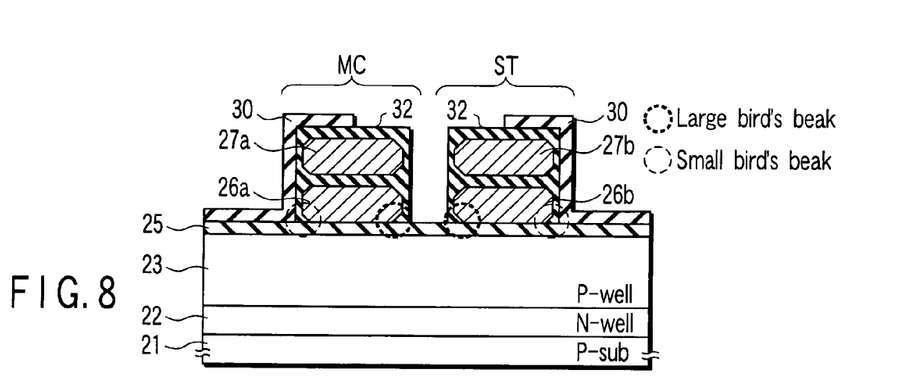
FIG. 8 is a view showing the first example of the method of manufacturing a cell unit of FIG. 4.

Next, as shown in FIG. 8, thermal oxidation is performed, and a thermal oxide film 32 is formed on a surface of the floating gate electrode 26a and a surface of the select gate electrode 26b.

The thermal oxide film 32 is also formed on a surface of the control gate electrode 27a and a surface of the upper electrode 27b.

Here, the main object of thermal oxidation process, after forming the floating gate electrode 26a and the select gate electrode 26b, is to round these edges; that is generally called post-oxide process.

At the time of thermal oxidation, the insulating film 30 functions as the mask for limiting the thermal oxidation of polysilicon as being the foundation. That is, it is possible to adjust the size of the bird's beak of the edge at the opposite side (drain side) to the select gate transistor ST of the floating gate electrode 26a and the edge at the opposite side (source side) to the memory cell MC of the select gate electrode 26b in accordance with thickness of the insulating film 30.

In the present example, because the insulating film 30 exists, the bird's beaks of both the edge at the select gate transistor ST side of the floating gate electrode 26a and the edge at the memory cell MC side of the select gate electrode 26b are larger than the bird's beaks of both the edge at the opposite side to the select gate transistor ST of the floating gate electrode 26a and the edge at the opposite side to the memory cell MC of the select gate electrode 26b.

Figure 9:
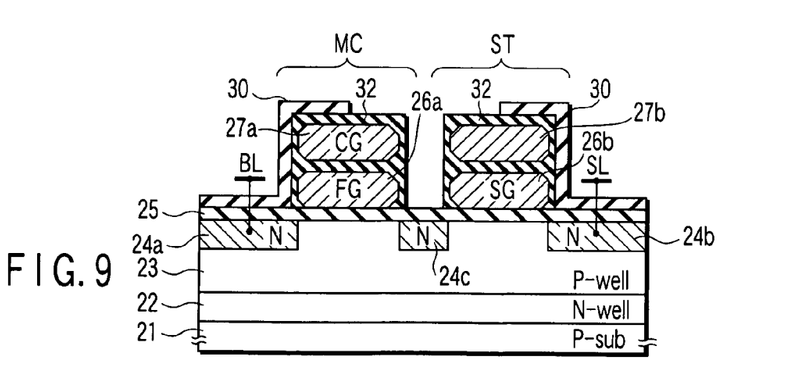
FIG. 9 is a view showing the first example of the method of manufacturing a cell unit of FIG. 4.

Next, as shown in FIG. 9, when implanting N-type impurity into the P-type well region 23 with self-alignment by the ion-implantation method, N-type diffusion layers 24a, 24b, and 24c are formed within the P-type well region 23.

After that, by the CVD method, an insulating film is formed which covers the memory cell MC and the select gate transistor ST. Further, the bit line BL is connected to the N-type diffusion layer 24a, and the source line SL is connected to the N-type diffusion layer 24b.

Due to the above processes, the device structure of FIG. 4 is completed.

Second Example

Figure 10:
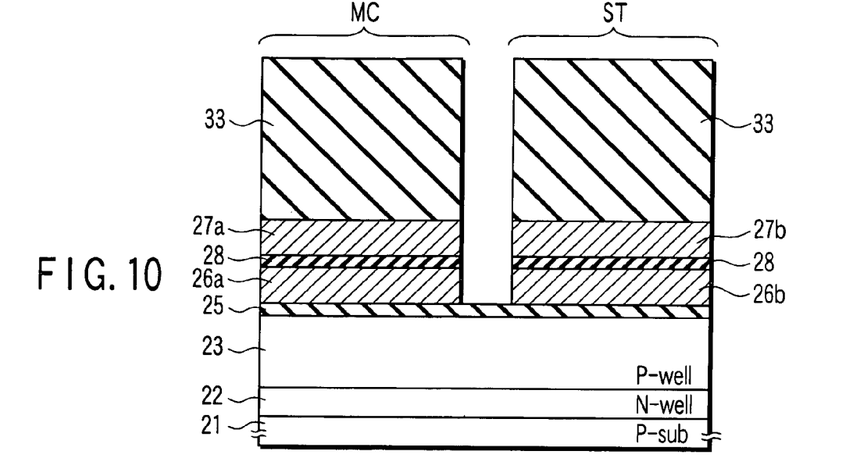
FIG. 10 is a view showing a second example of the method of manufacturing a cell unit of FIG. 4.

First, as shown in FIG. 10, a double well composed of an N-type well region 22 and a P-type well region 23 is formed on a surface region of the P-type semiconductor substrate 21. Further, after being subjected to an element separation process, for instance, a gate insulating film 25 made of a silicon oxide is formed on the P-type well region 23 by the CVD method.

After that, a first layer conductive polysilicon, an inter-polymer insulating film (for instance, laminated film of silicon oxide/silicon nitride/silicon oxide) 28, and a second layer conductive polysilicon are formed on the gate insulating film 25.

A resist pattern composed of a photoresist 33 is formed by the photolithography, and then, the second layer conductive polysilicon, inter-polymer insulating film 28 and the first layer conductive polysilicon are etched sequentially by RIE with the resist pattern as a mask.

As a result, the edge at the select gate transistor ST side of the floating gate electrode 26a of the memory cell MC and the edge at the memory cell MC side of the select gate electrode 26b of the select gate transistor ST are formed simultaneously.

After that, the photoresist 33 is removed.

Figure 11:
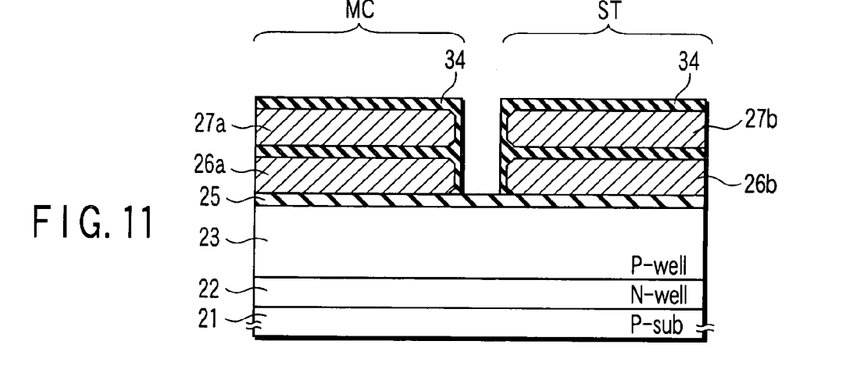
FIG. 11 is a view showing the second example of the method of manufacturing a cell unit of FIG. 4.

Next, as shown in FIG. 11, a first time thermal oxidation is performed to form the thermal oxide film 34 on a surface of the floating gate electrode 26a and a surface of the select gate electrode 26b. The thermal oxide film 34 is formed on both a surface of the control gate electrode 27a and a surface of the upper electrode 27b.

Figure 12:
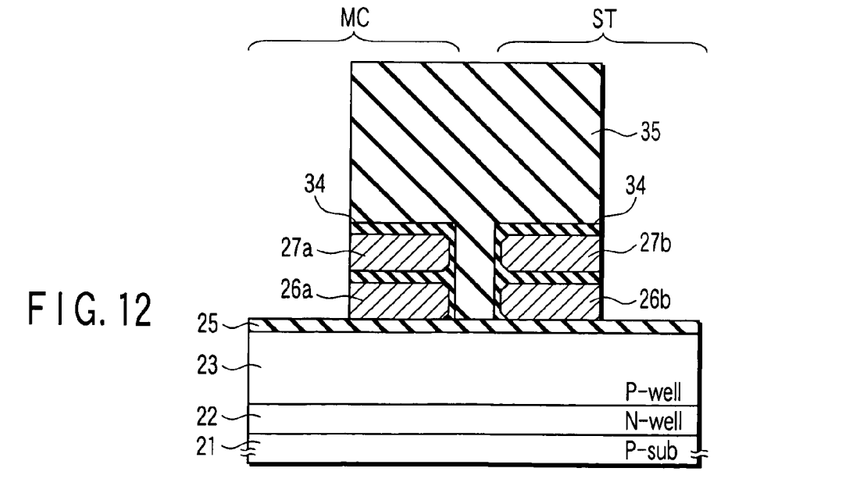
FIG. 12 is a view showing the second example of the method of manufacturing a cell unit of FIG. 4.

Next, as shown in FIG. 12, a resist pattern composed of a photoresist 35 is formed by the photolithography; then the second layer conductive polysilicon, inter-polymer insulating film 28 and the first layer conductive polysilicon are etched sequentially by RIE with the resist pattern as a mask.

As a result, the edge at the opposite side to the select gate transistor ST of the floating gate electrode 26a of the memory cell MC and the edge at the opposite side to the memory cell MC of the select gate electrode 26b of the select gate transistor ST are formed simultaneously.

After that, the photoresist 35 is removed.

Figure 13:
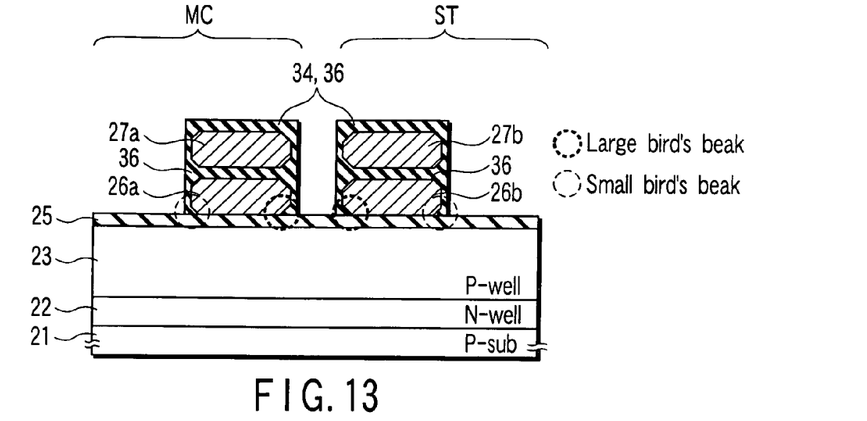
FIG. 13 is a view showing the second example of the method of manufacturing a cell unit of FIG. 4.

Next, as shown in FIG. 13, a second time thermal oxidation is performed, and a thermal oxide film 36 is formed on both a surface of the floating gate electrode 26a and a surface of the select gate electrode 26b. The thermal oxide film 36 is also formed on both a surface of the control gate electrode 27a and a surface of the upper electrode 27b.

Here, both the edge at the select gate transistor ST side of the floating gate electrode 26a and the edge at the memory cell MC side of the select gate electrode 26b are rounded due to two times of the thermal oxidation process, while both the edge at the opposite side to the select gate transistor ST of the floating gate electrode 26a and the edge at the opposite side to the memory cell MC of the select gate electrode 26b are rounded due to one time of thermal oxidation process.

Accordingly, the bird's beaks of both the edge at the select transistor ST side of the floating gate electrode 26a and the edge at the memory cell MC side of the select gate electrode 26b are larger than the bird's beaks of both the edge at the opposite side to the select gate transistor ST of the floating gate electrode 26a and the edge at the opposite side to the memory cell MC of the select gate electrode 26b.

Figure 14:
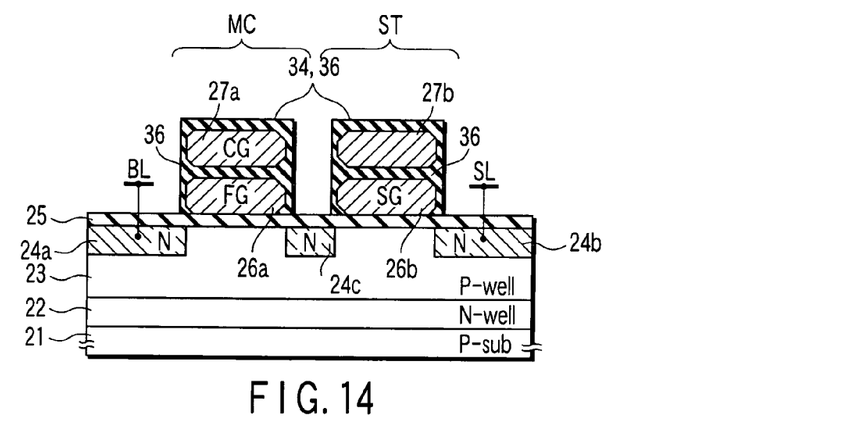
FIG. 14 is a view showing the second example of the method of manufacturing a cell unit of FIG. 4.

Next, as shown in FIG. 14, when implanting N-type impurity into the P-type well region 23 with self-alignment by the ion-implantation method, N-type diffusion layers 24a, 24b, and 24c are formed within the P-type well region 23.

After that, by the CVD method, an insulating film is formed which covers the memory cell MC and the select gate transistor ST. Further, the bit line BL is connected to the N-type diffusion layer 24a, and the source line SL is connected to the N-type diffusion layer 24b.

Due to the above processes, the device structure of FIG. 4 is completed.

(2) Second Embodiment

A. Device Structure

Figure 15:
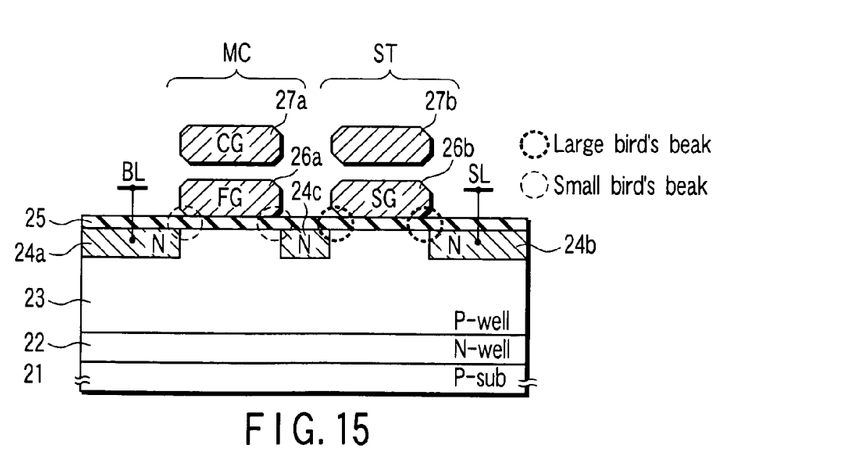
FIG. 15 is a view showing a device structure of a second embodiment.

FIG. 15 shows a cell unit configuring a memory cell array.

A double well composed of an N-type well region (N-well) 22 and a P-type well region (P-well) 23 is formed on a surface region of a P-type semiconductor substrate (P-sub) 21.

In the P-type well region 23, an N-type diffusion layer (drain) 24a connected to a bit line BL, an N-type diffusion layer (source) connected to a source line SL and an N-type diffusion layer (source/drain) 24c shared by the memory cell MC and the select gate transistor ST are formed.

A floating gate electrode 26a and a control gate electrode 27a are formed on a channel between the N-type diffusion layers 24a, 24c via a gate insulating film 25. Further, a select gate electrode 26b is formed on a channel between the N-type diffusion layers 24b, 24c via the gate insulating film 25.

Both the memory cell MC and the select gate transistor ST have stack gate structure. As for the select gate transistor ST, an upper electrode 27b may be electrically connected to a lower electrode (select gate electrode) 26b, or may be independent electrically.

Then, the bird's beak of the edge at the memory cell MC side of the select gate electrode 26b is larger than the bird's beak of at least one edge of the floating gate electrode 26a. In the present example, the bird's beak of the edge at the memory cell MC side of the select gate electrode 26b is larger than the bird's beaks of all the edges of the floating gate electrode 26a.

Due to this, since it is possible to relieve sufficiently a high electric field generated between the drain 24c of the select gate transistor ST and the select gate electrode 26b at the time of data writing, it is possible to realize both prevention of the leak current caused by the inter-band tunneling and improvement of the charge retention characteristics without deteriorating the writing characteristics.

B. Manufacturing Method

Next, there will be explained a method of manufacturing a device structure of FIG. 15.

Figure 16:
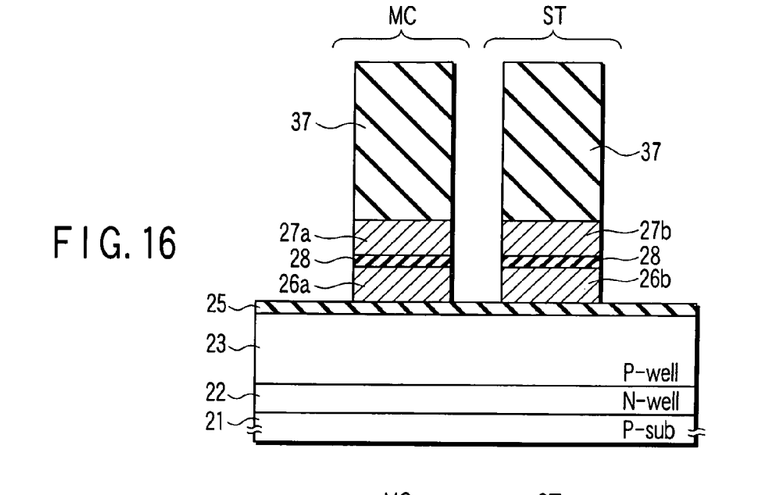
FIG. 16 is a view showing a method of manufacturing a cell unit of FIG. 15.

First, as shown in FIG. 16, a double well composed of an N-type well region 22 and a P-type well region 23 is formed on a surface region of a P-type semiconductor substrate 21. Further, after being subjected to an element separation process, for instance, a gate insulating film 25 made of a silicon oxide is formed on the P-type well region 23 by the CVD method.

After that, a first layer conductive polysilicon, an inter-polymer insulating film (for instance, laminated film of silicon oxide/silicon nitride/silicon oxide) 28 and a second layer conductive polysilicon are formed on the gate insulating film 25.

A resist pattern composed of a photoresist 37 is formed by the photolithography, and then, the second layer conductive polysilicon, the inter-polymer insulating film 28 and the first layer conductive polysilicon are etched sequentially by RIE with the resist pattern as a mask.

As a result, the floating gate electrode 26a of the memory cell MC and the control gate electrode 27a are formed, and the select gate electrode 26b of the select gate transistor ST is formed.

After that, the photoresist 37 is removed.

Figure 17:
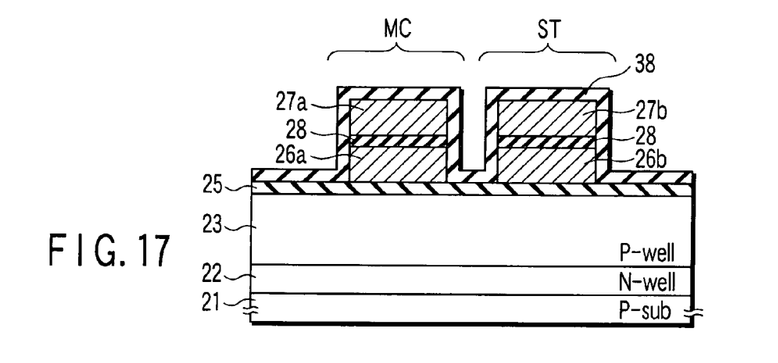
FIG. 17 is a view showing the method of manufacturing a cell unit of FIG. 15.

Next, as shown in FIG. 17, an insulating film 38, which covers the memory cell MC and the select gate transistor ST, is formed by the CVD method. The insulating film 38 is made of a material having a property for permeating oxygen, for instance, the silicon oxide.

Figure 18:
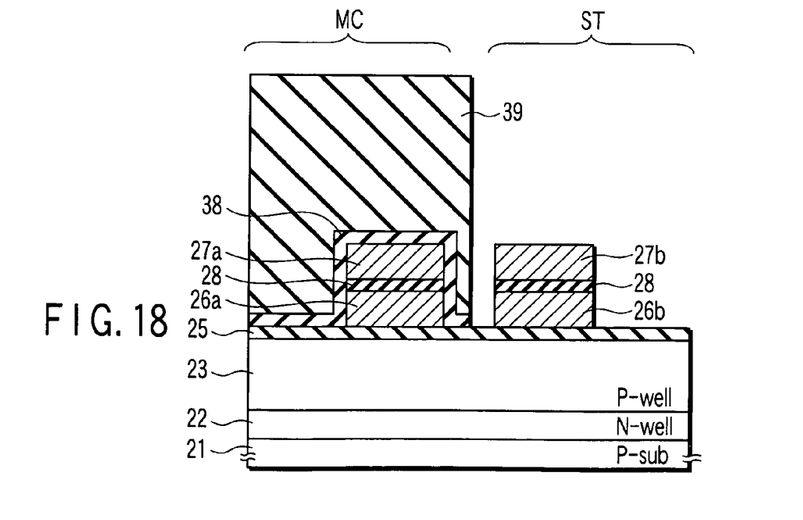
FIG. 18 is a view showing the method of manufacturing a cell unit of FIG. 15.

Next, as shown in FIG. 18, a resist pattern composed of a photoresist 39 is formed by the photolithography; then the insulating film 38 is etched by RIE with this resist pattern as the mask.

As a result, all the edges of the floating gate electrode 26a and the control gate electrode 27a become covered state with the insulating film 38 respectively, while all the edges of the select gate electrode 26b and the upper electrode 27b are made exposed, respectively.

After that, the photoresist 39 is removed.

Figure 19:
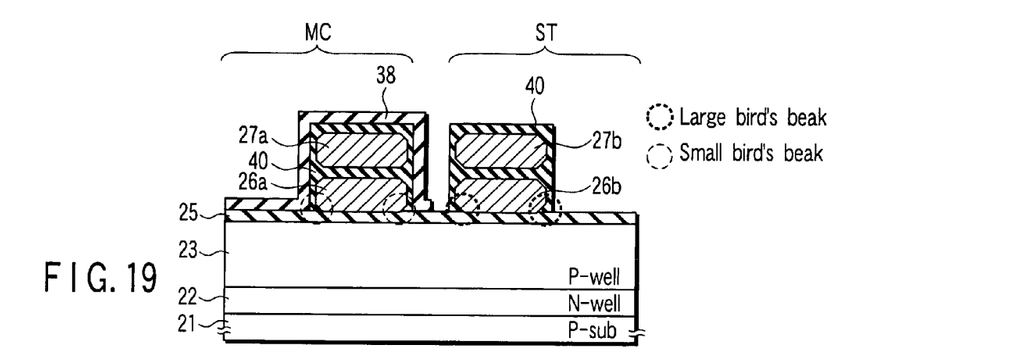
FIG. 19 is a view showing the method of manufacturing a cell unit of FIG. 15.

Next, as shown in FIG. 19, thermal oxidation is performed, and a thermal oxide film 40 is formed on a surface of the floating gate electrode 26a and a surface of the select gate electrode 26b.

The thermal oxide film 40 is also formed on a surface of the control gate electrode 27a and a surface of the upper electrode 27b.

At the time of thermal oxidation, the insulating film 38 functions as the mask for limiting the thermal oxidation of polysilicon as being the foundation. That is, it is possible to adjust the size of the bird's beak of the edge of the floating gate electrode 26a in accordance with thickness of the insulating film 38.

In the present example, due to existence of the insulating film 38, the bird's beak of the edge of the select gate electrode 26b is larger than the bird's beaks of all the edges of the floating gate electrode 26a.

Figure 20:
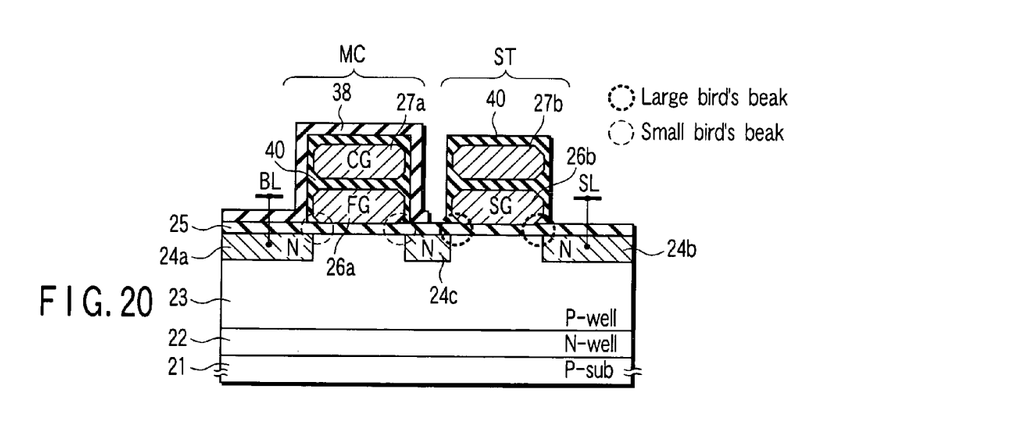
FIG. 20 is a view showing the method of manufacturing a cell unit of FIG. 15.

Next, as shown in FIG. 20, when implanting N-type impurity into the P-type well region 23 with self-alignment by the ion-implantation method, N-type diffusion layers 24a, 24b, and 24c are formed within the P-type well region 23.

After that, by the CVD method, an insulating film is formed which covers the memory cell MC and the select gate transistor ST. Further, the bit line BL is connected to the N-type diffusion layer 24a, and the source line SL is connected to the N-type diffusion layer 24b.

Due to the above processes, the device structure of FIG. 15 is completed.

(3) Third Embodiment

A. Device Structure

Figure 21:
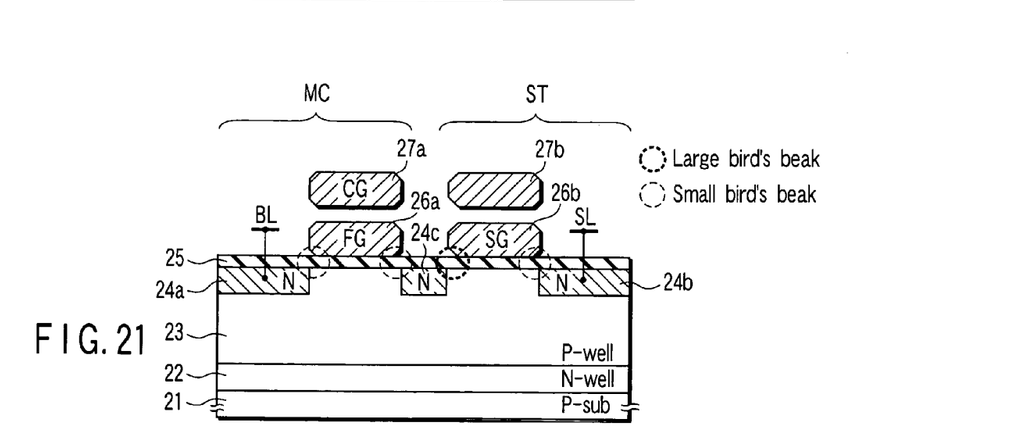
FIG. 21 is a view showing a device structure of a third embodiment.

FIG. 21 shows a cell unit configuring a memory cell array.

A double well composed of an N-type well region (N-well) 22 and a P-type well region (P-well) 23 is formed on a surface region of a P-type semiconductor substrate (P-sub) 21.

In the P-type well region 23, an N-type diffusion layer (drain) 24a connected to a bit line BL, an N-type diffusion layer (source) 24b connected to a source line SL and an N-type diffusion layer (source/drain) 24c shared by the memory cell MC and the select gate transistor ST are formed.

A floating gate electrode 26a and a control gate electrode 27a are formed on a channel between the N-type diffusion layers 24a, 24c via a gate insulating film 25. Further, a select gate electrode 26b is formed on a channel between the N-type diffusion layers 24b, 24c via the gate insulating film 25.

Both the memory cell MC and the select gate transistor ST have stack gate structure. As for the select gate transistor ST, an upper electrode 27b may be electrically connected to a lower electrode (select gate electrode) 26b, or may be independent electrically.

Then, the bird's beak of the edge at the memory cell MC side of the select gate electrode 26b is larger than the bird's beak of at least one edge of the floating gate electrode 26a.

In the present example, the bird's beak of the edge at the memory cell MC side of the select gate electrode 26b is larger than the bird's beaks of all the edges of the floating gate electrode 26a and the bird's beak of the edge at the opposite side to the memory cell MC of the select gate electrode 26b.

Due to this, since it is possible to relieve sufficiently a high electric field generated between the drain 24c of the select gate transistor ST and the select gate electrode 26b at the time of data writing, it is possible to realize both prevention of the leak current caused by the inter-band tunneling and improvement of the charge retention characteristics without deteriorating the writing characteristics.

B. Manufacturing Method

Next, there will be explained a method of manufacturing a device structure of FIG. 21.

Figure 22:
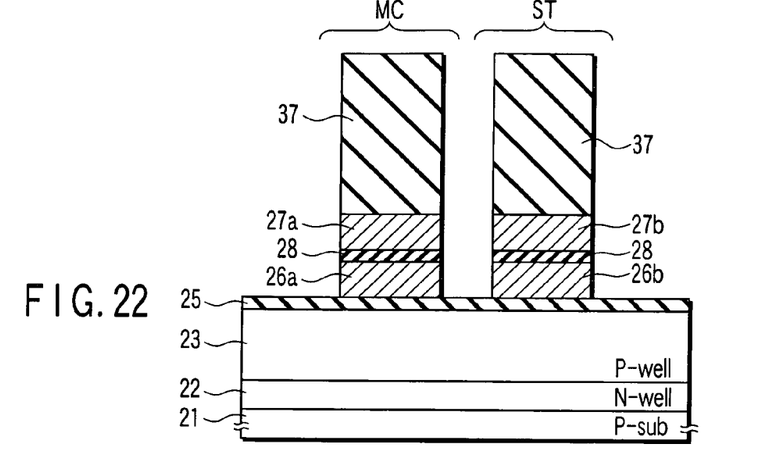
FIG. 22 is a view showing a method of manufacturing a cell unit of FIG. 21.

First, as shown in FIG. 22, a double well composed of an N-type well region 22 and a P-type well region 23 is formed on a surface region of a P-type semiconductor substrate 21. Further, after being subjected to an element separation process, for instance, a gate insulating film 25 made of a silicon oxide is formed on the P-type well region 23 by the CVD method.

After that, a first layer conductive polysilicon, inter-polymer insulating film (for instance, laminated film of silicon oxide/silicon nitride/silicon oxide) 28 and a second layer conductive polysilicon are formed on the gate insulating film 25.

A resist pattern composed of a photoresist 37 is formed by the photolithography, and then, the second layer conductive polysilicon, the inter-polymer insulating film 28 and the first layer conductive polysilicon are etched sequentially by RIE with the resist pattern as a mask.

As a result, the floating gate electrode 26a of the memory cell MC and the control gate electrode 27a are formed, and the select gate electrode 26b of the select gate transistor ST is formed.

After that, the photoresist 37 is removed.

Figure 23:
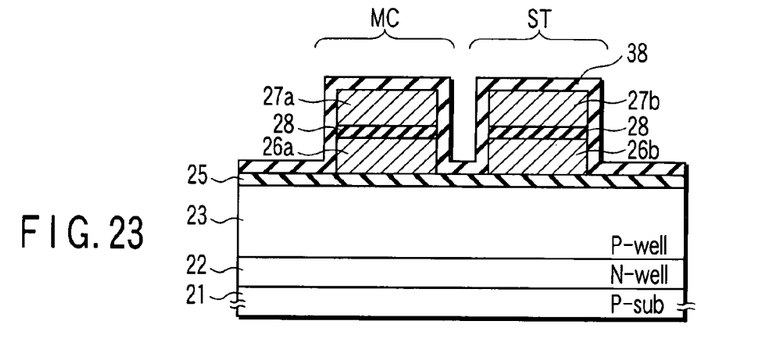
FIG. 23 is a view showing the method of manufacturing a cell unit of FIG. 21.

Next, as shown in FIG. 23, an insulating film 38, which covers the memory cell MC and the select gate transistor ST, is formed by the CVD method. The insulating film 38 is made of a material having a property for permeating oxygen, for instance, the silicon oxide.

Figure 24:
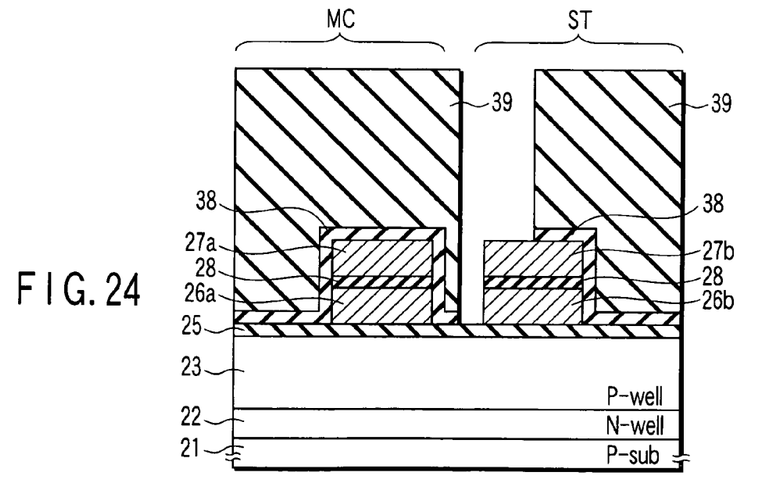
FIG. 24 is a view showing the method of manufacturing a cell unit of FIG. 21.

Next, as shown in FIG. 24, a resist pattern composed of a photoresist 39 is formed by the photolithography; then the insulating film 38 is etched by RIE with this resist pattern as the mask.

As a result, all the edges of the floating gate electrode 26a and the control gate electrode 27a become covered state with the insulating film 38, respectively, and also the edge of the select gate electrode 26b and the edge at the opposite side to the memory cell MC of the upper electrode 27b become covered state with the insulating film 38, respectively.

On the other hand, the edge of the select gate electrode 26b and the edge at the memory cell MC side of the upper electrode 27b are exposed, respectively.

After that, the photoresist 39 is removed.

Figure 25:
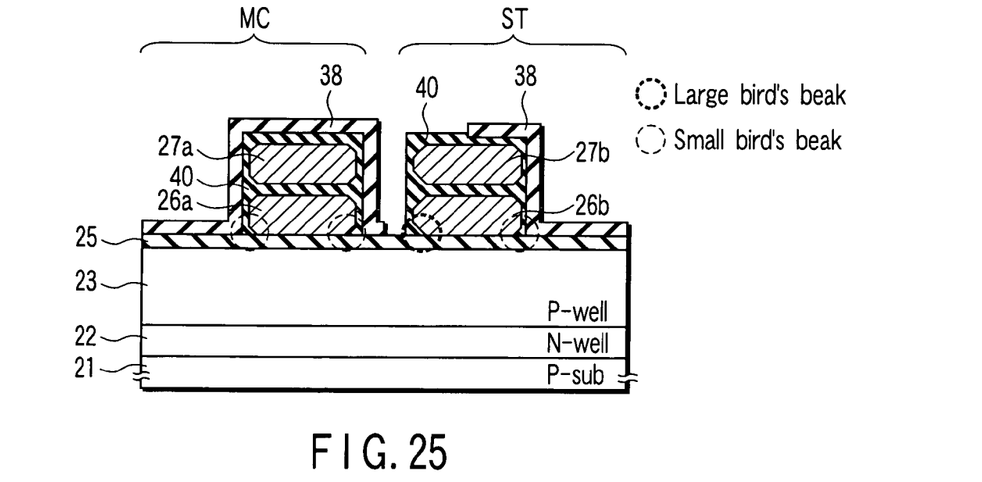
FIG. 25 is a view showing the method of manufacturing a cell unit of FIG. 21.

Next, as shown in FIG. 25, thermal oxidation is performed, and a thermal oxide film 40 is formed on a surface of the floating gate electrode 26a and a surface of the select gate electrode 26b.

The thermal oxide film 40 is also formed on a surface of the control gate electrode 27a and a surface of the upper electrode 27b.

At the time of thermal oxidation, the insulating film 38 functions as the mask for limiting the thermal oxidation of polysilicon as being the foundation. That is, in accordance with thickness of the insulating film 38, it is possible to adjust the size of the bird's beak of the edge immediately below the insulating film 38.

In the present example, due to existence of the insulating film 38, the bird's beak of the edge at the memory cell MC side of the select gate electrode 26b is larger than the bird's beaks of all the edges of the floating gate electrode 26a and the bird's beak of the edge at the opposite side to the memory cell MC of the select gate electrode 26b.

Figure 26:
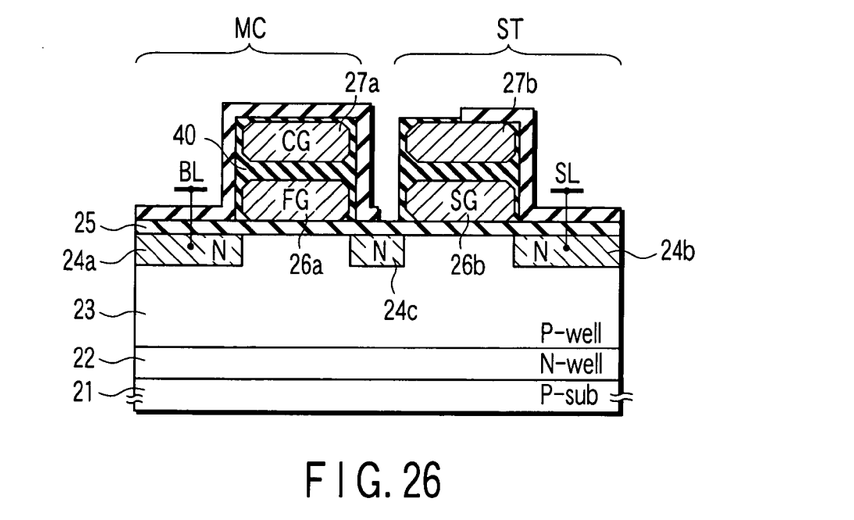
FIG. 26 is a view showing the method of manufacturing a cell unit of FIG. 21.

Next, as shown in FIG. 26, when implanting N-type impurity into the P-type well region 23 with self-alignment by the ion-implantation method, N-type diffusion layers 24a, 24b, and 24c are formed within the P-type well region 23.

After that, by the CVD method, an insulating film is formed which covers the memory cell MC and the select gate transistor ST. Further, the bit line BL is connected to the N-type diffusion layer 24a, and the source line SL is connected to the N-type diffusion layer 24b.

Due to the above processes, the device structure of FIG. 21 is completed.

3. EXPERIMENT EXAMPLE

There will be explained a relationship between the bird's beak and the leak current (inter-band tunnel current) obtained with an experiment about a device structure concerned with the examples of the present invention and a conventional device structure below.

Figure 27A:
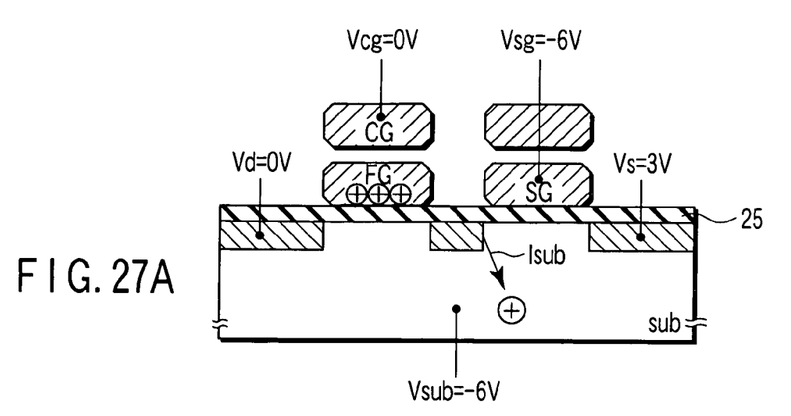
FIGS. 27A and 27B are views showing a relationship between a bird's beak and a leak current.

A sample is a NANO-type flash memory as shown in FIG. 4, and a voltage relation in the unselected unit is such that, as shown in FIG. 27A, a source voltage Vs is set to 3 V, a drain voltage Vd is set to 0 V, a substrate voltage Vsub is set to −6 V, a control gate voltage Vcg is set to 0 V, a select gate voltage Vsg is set to −6 V.

The memory cell is in the state that the hole (plus charge) is accumulated at a floating gate electrode FG.

Figure 27B:
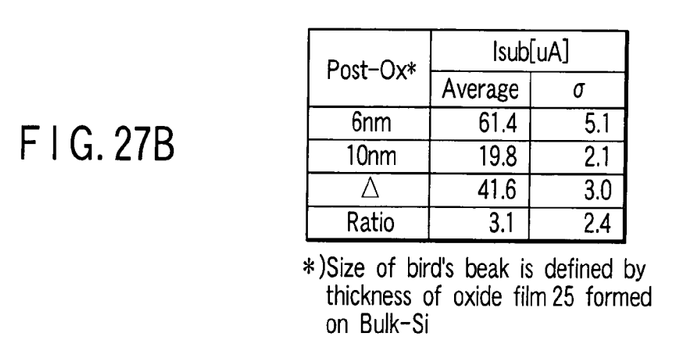

In this case, as shown in FIG. 27B, when the bird's beak (Post-Ox) of the edge at the memory cell side of the select gate electrode SG is, as being the conventional device structure, approximately 6 nm while specifying it with thickness of the oxide film 25 on the semiconductor substrate (Bulk-Si), an average value of the leak current Isub results in a very large value of 61.4 µA.

On the contrary, when the bird's beak (Post-Ox) of the edge at the memory cell side of the select gate electrode SG is, as being the device structure concerned with the example of the present invention, approximately 10 nm while specifying it with thickness of the oxide film 25 on the semiconductor substrate (Bulk-Si), an average value of the leak current Isub results in a small value of 19.8 µA.

Thus, with respect to the average value of the leak current Isub, difference A between both is 41.6 µA, and it is possible to suppress the average value to approximately $1/3$ of the conventional one in the percentage. Further, with respect to a scattering σ, difference Δ between both is 3.0 µA, and it is possible to suppress the average value to approximately $1/2.5$ of the conventional one in the percentage.

4. APPLICATION EXAMPLE

Next, there will be explained application example of a cell unit concerned with the example of the present invention.

Figure 28:
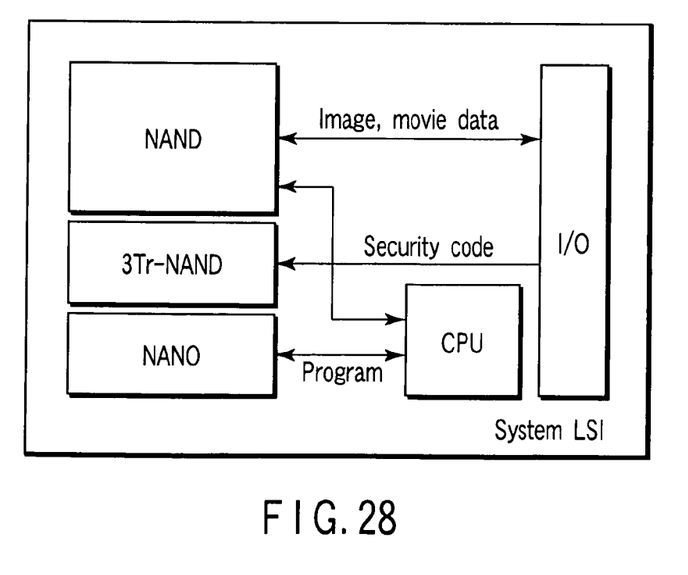
FIG. 28 is a view showing a system LSI to which an example of the present invention is applied.

FIG. 28 shows an example of a system LSI.

In recent years, the system LSI used for a special use is attracting attention. The system LSI is, for instance, an SoC (system on chip) in which a plurality of functional blocks are mixed and mounted within one chip, and includes a microcomputer (MC), a microprocessor (MPU), and the like.

In the present example, the flash memory (NAND, 3Tr-NAND, and NANO) and CPU are mixed and mounted within one chip. An I/O is an input/output circuit.

Here, with respect to the respective flash memories, it is possible to apply the device structure concerned with the example of the present invention thereto.

Figure 29:
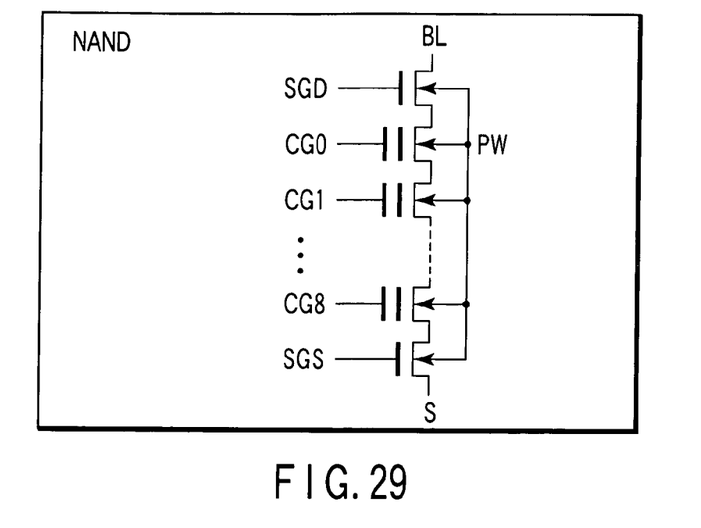
FIG. 29 is a view showing a cell unit of a NAND-type flash memory.
Figure 30:
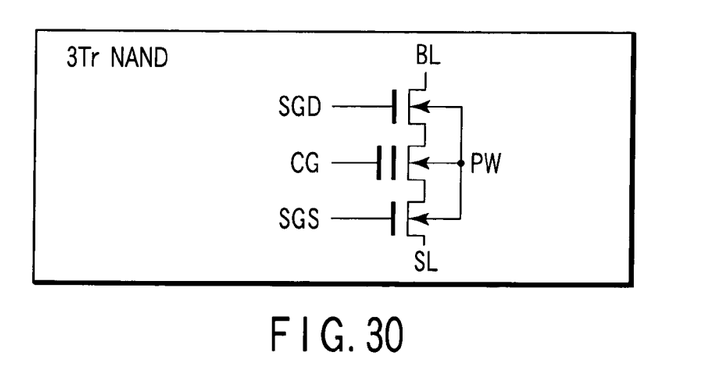
FIG. 30 is a view showing a cell unit of 3Tr-NAND type flash memory.

For instance, in the NAND-type flash memory, as shown in FIG. 29, the cell unit is comprised with two select gate transistors and a plurality of memory cells connected in series therebetween. Further, in the 3Tr NAND-type flash memory, as shown in FIG. 30, the cell unit is comprised from two select gate transistors and one memory cell connected in series therebetween.

In this case, the respective bird's beaks of the edges at the memory cell side of the select gate electrodes of the two select gate transistors are made larger than the bird' beak of at least one edge of the floating gate electrode of the memory cell, thereby making it possible to realize prevention of the leak current caused by the inter-band tunneling and improvement of the charge retention characteristics without deteriorating the writing characteristics.

Figure 31:
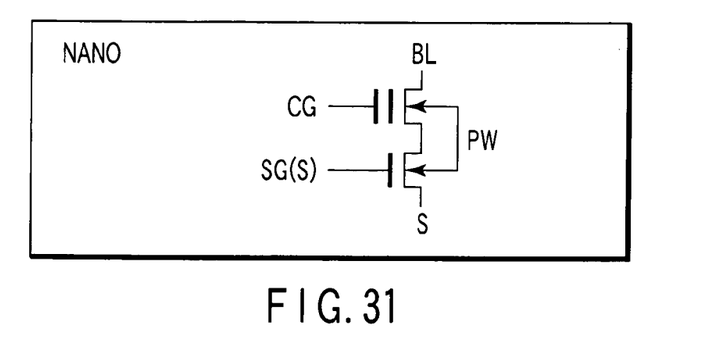
FIG. 31 is a view showing a cell unit of a NANO-type flash memory.

Further, as shown in FIG. 31, the NANO-type flash memory comprises the cell unit comprised with one select gate transistor and one memory cell connected in series.

In this case, the bird's beak of the edge at the memory cell side of the select gate electrode of the select gate transistor is made larger than the bird's beak of at least one edge of the floating gate electrode of the memory cell, thereby making it possible to realize prevention of the leak current caused by the inter-band tunneling and improvement of the charge retention characteristics without deteriorating the writing characteristics.

5. OTHERS

According to the example of the present invention, it is possible to realize prevention of the leak current caused by the inter-band tunneling and improvement of the charge retention characteristics without deteriorating the writing characteristics.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
   a memory cell having a floating gate electrode and a control gate electrode; and
   a select gate transistor having a select gate electrode and connected to the memory cell in series, wherein a bird's beak of an edge at the memory cell side of the select gate electrode is larger than a bird's beak of at least one edge of the floating gate electrode, wherein the bird's beak of the edge at the memory cell side of the select gate electrode is larger than the bird's beak of the edge at an opposite side to the memory cell of the select gate electrode.

2. The nonvolatile semiconductor memory according to claim 1, wherein the bird's beak of the edge at the memory cell side of the select gate electrode is larger than the bird's beaks of all the edges of the floating gate electrode.

3. The nonvolatile semiconductor memory according to claim 1, wherein data writing is performed to the memory cell using an FN tunneling.

4. The nonvolatile semiconductor memory according to claim 1, wherein both the memory cell and the select gate transistor have a stack gate structure.

5. The nonvolatile semiconductor memory according to claim 1, wherein both the memory cell and the select gate transistor are N channel MOS transistors.

6. The nonvolatile semiconductor memory according to claim 1, wherein both the memory cell and the select gate transistor comprise one type of the cell unit among a NAND-type, a 3Tr NAND-type and a NANO-type.

7. The nonvolatile semiconductor memory according to claim 1, wherein both the memory cell and the select gate transistor comprise a memory within a system LSI.

* * * * *